United States Patent
Lowack et al.

(10) Patent No.: US 6,905,726 B2
(45) Date of Patent: Jun. 14, 2005

(54) COMPONENT HAVING AT LEAST TWO MUTUALLY ADJACENT INSULATING LAYERS AND CORRESPONDING PRODUCTION METHOD

(75) Inventors: Klaus Lowack, Erlangen (DE); Günter Schmid, Hemhofen (DE); Recai Sezi, Röttenbach (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/817,967

(22) Filed: Mar. 27, 2001

(65) Prior Publication Data
US 2003/0207095 A1 Nov. 6, 2003

(30) Foreign Application Priority Data
Mar. 27, 2000 (DE) .......................... 100 15 215

(51) Int. Cl.⁷ ................................. B05D 3/04
(52) U.S. Cl. ................ 427/96; 427/99; 427/124; 427/255.1; 427/301; 427/304; 430/270.1
(58) Field of Search ................. 427/96, 99, 118, 427/124, 301, 304; 428/209, 210

(56) References Cited

U.S. PATENT DOCUMENTS

| | | | |
|---|---|---|---|
| 3,839,083 A * | 10/1974 | Sihvonen et al. | 117/212 |
| 3,957,512 A | 5/1976 | Kleeberg et al. | |
| 4,424,095 A * | 1/1984 | Frisch et al. | 156/629 |
| 4,425,380 A * | 1/1984 | Nuzzi et al. | 427/97 |
| 4,448,804 A | 5/1984 | Amelio et al. | |
| 4,478,677 A | 10/1984 | Chen et al. | |
| 4,574,094 A * | 3/1986 | DeLuca et al. | 427/96 |
| 4,618,568 A * | 10/1986 | Gemmler | 430/417 |
| 4,666,739 A | 5/1987 | Roubal | |
| 4,666,744 A * | 5/1987 | DeLuca et al. | 427/304 |
| 4,668,532 A | 5/1987 | Moisan et al. | |
| 4,689,111 A * | 8/1987 | Chan et al. | 156/643 |
| 4,701,352 A * | 10/1987 | DeLuca et al. | 427/98 |
| 4,810,326 A * | 3/1989 | Babu et al. | 156/629 |
| 4,992,144 A * | 2/1991 | Walsh et al. | 204/20 |
| 5,021,129 A | 6/1991 | Arbach et al. | |
| 5,169,680 A | 12/1992 | Ting et al. | |
| 5,238,702 A | 8/1993 | Giesecke et al. | |
| 5,380,560 A * | 1/1995 | Kaja et al. | 427/306 |
| 5,556,812 A * | 9/1996 | Leuschner et al. | 437/209 |
| 5,648,125 A * | 7/1997 | Cane | 427/534 |
| 5,770,032 A * | 6/1998 | Cane | 205/210 |

FOREIGN PATENT DOCUMENTS

| | | |
|---|---|---|
| DE | 1 571 802 | 2/1971 |
| DE | 31 38 474 A1 | 4/1983 |
| DE | 195 40 309 A1 | 4/1997 |
| DE | 198 13 180 A1 | 10/1999 |
| EP | 0 023 662 B1 | 2/1981 |
| EP | 0 027 506 A1 | 4/1981 |
| EP | 0 264 678 B1 | 4/1988 |
| EP | 0 284 624 B1 | 10/1988 |
| EP | 0 498 258 A1 | 8/1992 |
| WO | WO 99/21706 | 5/1999 |
| WO | WO 99/34424 | 7/1999 |

* cited by examiner

*Primary Examiner*—Cathy F. Lam
(74) *Attorney, Agent, or Firm*—Laurence A. Greenberg; Werner H. Stemer; Ralph E. Locher

(57) ABSTRACT

The invention relates to a component having two adjacent insulating layers and to a production process therefore. The component has an activated insulating layer, which can be converted into an electrically conductive layer by metallization.

12 Claims, No Drawings

COMPONENT HAVING AT LEAST TWO MUTUALLY ADJACENT INSULATING LAYERS AND CORRESPONDING PRODUCTION METHOD

BACKGROUND OF THE INVENTION

FIELD OF THE INVENTION

The invention relates to a component having at least two adjacent insulating layers and to a production process therefore.

In electronic and microelectronic components, neighboring electrical interconnects are isolated from one another by an insulator (insulating layer). In order to insulate the interconnects next to one another or above one another, especially in an integrated circuit (IC) or a multichip module (MCM), a high-temperature-stable organic or inorganic material is used. In this case, materials such as e.g. polyimide, benzocyclobutene, polybenzoxazole and/or silicon dioxide are used. The choice of the material is dictated by the physical property of the insulator (low-stress behaviour; photosensitivity; water-vapor permeability; oxygen permeability; metal diffusibility etc.) which is regarded as important, because the materials which can be used have different physical property profiles.

The physical weaknesses of the chosen insulating material are either not compensated for or are compensated for by an extra covering (e.g. to reduce the water-vapor permeability), a substrate back coating (e.g. to lessen stress-induced substrate flexion) or another auxiliary structure.

SUMMARY OF THE INVENTION

It is an object of the present invention to provide a component which includes at least two insulating layers, with the possibility of compensating for the physical weaknesses of one insulating layer by the subsequent insulating layer. A further subject of the invention is a process for the production of such a component.

The object of the invention is achieved by and the subject of the invention is a component which includes a substrate and at least one upper and one lower insulating layer, which are adjacent to each other and whose layer thickness is in the range of between 0.05 and 50 µm, at least one region of one insulating layer being activated for subsequent metallization, for photosensitization, for hydrophobicization and/or for other surface functionalization.

A further subject of the invention is a process for the production of a component, a lower insulating layer being applied to a substrate and optionally patterned in a first working step, at least one region of the lower insulating layer being activated in a second working step and at least one second, upper insulating layer being applied to the lower, activated insulating layer and patterned in a third working step.

A final subject of the invention is a process for the production of a component, an insulating layer being applied to a substrate and optionally patterned in a first working step, a further insulating layer being applied and patterned in a second working step, and one of the two insulating layers being activated in a third working step.

The component is preferably an electronic or microelectronic component. It has, again preferably, two insulation layers which are chemically different and, accordingly, also have different physical property profiles. For instance, the first layer may exhibit good low-stress behaviour but have excessive water permeability, and the second layer may be water-impermeable so as to compensate for the permeability of the first insulation layer. One layer is activated and is intended to provide the electrically conductive layer later on, for example, in the wafer production process by seeding with a seed solution and subsequent metallization. In spite of the metallization or other subsequent processing, the initially activated insulation layer keeps its desired physical properties, e.g. water impermeability.

The number of layers located above one another is by no means restricted to two, but may be as many as desired, depending on the component, and it is also possible for two similar layers to be located above one another if the lower layer is activated before the upper layer is applied.

It has been found to be advantageous if the upper insulating layer is used as a mask during the activation of the lower insulating layer. To that end, the patterning of the upper insulating layer must take place in the process prior to the activation. By exposure, developing, drying and/or baking, it is possible to pattern the upper, preferably photosensitive insulating layer. If the upper insulating layer is not photosensitive, then the mask can be produced by conventional coating with photoresist and patterning the latter, then etching back the upper insulating layer.

According to another embodiment, the lower insulating layer is activated before the upper insulating layer is applied.

Which of the two layers is activated, is dictated primarily by whether the activator in question reacts via its constituents only with one layer and, if the activator could potentially activate both layers, when the activator is employed, i.e. which surface it encounters.

The term "insulating layer or insulation layer" is here intended to mean an electrically insulating material which remains in the component after this component has been fabricated, i.e. is not removed. This is not intended to include materials which are used as patterning auxiliaries and are removed after a process (e.g. metallization, etching) has been carried out, for instance commercial photoresists based on novolak. Likewise, materials which are a constituent of the substrate (e.g. printed circuit boards based on epoxy resin) or are used as a covering (e.g. a passivation layer on a silicon oxide and/or nitride IC or an IC package of filled epoxy resin, i.e. a mould compound) are not "insulating layers" in the sense of the term used here.

The thickness of the insulating layer is preferably between 0.05 and 50 µm, particularly preferably between 0.1 and 20 µm.

The insulating layer preferably consists of a polymer. The polymer advantageously has high chemical and thermal stability. This allows it to withstand soldering and cleaning processes as well as the activation (chemical and/or physical) without being damaged. In particular, the use of the following types of polymers has proved to be advantageous: dielectrics such as polyimides (such as e.g. in U.S. Pat. No. 3,957,512 and EP 0 027 506 B1), polybenzoxazoles (such as e.g. disclosed by EP 0 023 662 B1 and EP 0 264 678 B1), polybenzimidoxazoles; predominantly aromatic polyethers, polyether ketones, polyether sulphones; benzocyclobutene, aromatic hydrocarbons, polyquinolines, polyquinoxalines, polysiloxanes (silicones), polyurethanes or epoxy resins. Copolymers or mixtures of these polymers with one another are likewise suitable. Also suitable are compounds or polymers with organic-inorganic structure, such as e.g. organosilicon, organophosphorus or organoboron compounds. As is known, all the material classes may either be applied in their final form (spin coating, screen printing etc.) or, alternatively, they are vapor-deposited on the substrate, or on the first insulation layer, in a preliminary stage and the polymer is produced there. Examples of layers which can be produced on the substrate, or on an insulating layer, include layers of carbon, a-C:H (amorphous) as well as a-C:H layers with further elements such as Si, P, O or B. Purely inorganic materials such as silicon oxide and nitride are only included in this category if, as the upper of the two layers, they are applied and patterned or are applied using a shadow mask, a printing technique and/or lithography.

In principle, all materials are suitable which are stable during the processes to be carried out, exhibit good electrical insulation and do not have a perturbing effect on the finished component. Photosensitive formulations of the insulating materials are especially suitable.

The insulating layer may also contain several of the aforesaid constituents and a filler. Especially for use as a paste, but also for screen printing, a suitable filler may be added to the insulating material. It may, for example, be applied to the substrate in dissolved form or as a paste. Examples of suitable techniques include spin coating, casting, dispensing, scraping, tampon printing, inkjet printing and/or screen printing.

A first insulating layer is applied to the substrate, for example by spin coating technique, and is cured if appropriate, when this is necessary in order to obtain the final properties. The second insulation layer is then applied to the first, and is dried if appropriate. Next, e.g. for patterning, it is exposed through a mask, developed, dried and optionally cured. The subsequent treatment of the resulting layer sandwich with an activator leads to selective activation of either the upper or the lower insulation layer. It is also possible to apply the second insulating layer ready-patterned, e.g. by printing.

The term "curing" refers to any process by which soluble products are converted into insoluble products. Examples include baking, cyclicizing and cross-linking.

The surface activation of the insulating layer in question can, as explained in more detail below, be carried out using a physical process and/or using a chemical process.

The activation can be carried out by immersion, etching, exposure, irradiation, sputtering, heating, partial dissolving, wetting or another known technique.

Depending on the embodiment, the activator is a gas (or a gas mixture), a liquid, a solution or a plasma. The activator may, in particular, also be a combination of a gas with a liquid or a different combination of several activators. The activation selectively modifies an insulation layer or the surface of an insulation layer, for example so that subsequently only this layer can be seeded and/or metallized. Other types of activation, e.g. hydrophobicization, photosensitization and/or other types of surface functionalization, also fall within the scope of the invention.

Liquid activators are e.g. basic reagents such as solutions of one or more alkali metal and/or alkaline earth metal hydroxides, ammonium hydroxides; oxidizing reagents such as hydrogen peroxide, chromate, permanganate, (per) chlorate and/or peroxosulphate solution; solutions which contain an acid such as sulphuric, hydrochloric, nitric and/or phosphoric acid. All the solutions may be used individually or in any desired combination.

Examples of activators which are in plasma form include: oxygen, chlorine, carbon dioxide, sulfur dioxide, noble gas and/or ammonia plasmas; examples of suitable gases include ozone, oxygen, halogens and/or sulfur dioxide, and mixtures thereof.

The seed solution is a solution or emulsion of a metal (or of a metal compound) in ionogenic or colloidal form. This solution may be neutral, basic or acidic. Preferred seed solutions are all solutions of metals and non-metals, or compounds thereof, which catalyze the subsequent deposition of a metal (such as e.g. copper or nickel). The seed solution preferably contains noble metals (ruthenium (Ru), rhodium (Rh), palladium (Pd), osmium (Os), iridium (Ir), platinum (Pt), silver (Ag), gold (Au)), or compounds and complexes thereof (organic and/or inorganic).

The substrate is preferably a semiconductor (silicon (Si), gallium arsenide, germanium (Ge)) or ceramic, and it may already have electronic circuits including metal and insulating layers below the first insulating layer (e.g. a front-end processed substrate). The substrate may, however, also be glass, a printed circuit board and/or a metal. The substrate may furthermore be one of the aforesaid materials with an applied insulating layer.

The process is advantageous, in particular, because many electronic and/or microelectronic components—before they are processed with the at least two insulating layers—are coated with a buffer coating (for example, wafers in the front-end field come in this form; the buffer coating is, for example, polyimide or polybenzoxazole; the inorganic passivation layers of silicon nitride and/or oxide, for example, are located underneath). This buffer coating may already be an insulating layer in the sense of the invention, i.e. after the second layer has been applied and patterned, it may be activated and, according to one embodiment of the process, it may be coated with a second insulating layer or activated.

The invention will be explained in more detail with reference to exemplary embodiments.

DESCRIPTION OF THE PREFERRED EMBODIMENTS

EXAMPLE 1

A commercially available wafer with an already cured, i.e. cyclicized and/or baked, polyimide coating is activated as follows: the polyimide is activated by a short etching operation lasting 25 s in an oxygen plasma (500 W, 50 sccm oxygen, 50 mTorr). The activated wafer is immersed for 10 s in demonized water, the water is spun off and the wafer is dried for 60 s at 120° C. A second coat of a photosensitive polyimide is then spin-coated on, patterned and baked in an oven at 400° C. under nitrogen. The plasma activation creates the activated surface, to which metal seeds (e.g. a metal complex) can bind selectively.

EXAMPLE 2

A photosensitive polyimide is, according to the manufacturer's specifications, spin-coated onto a silicon substrate, exposed, developed and baked (see Example 1). To activate the polyimide, the substrate is then immersed in the following solutions:

10 min in an alkaline permanganate solution, consisting of 140 g/l sodium permanganate and 50 g/l sodium hydroxide, at a temperature of 40° C.

washing in deionized water immersion for 3 min at room temperature in semi-concentrated sulfuric acid (5 mol/l)

washing in deionized water.

A second coat of polyimide is then spin-coated on and, as described above, patterned and cured (see Example 1).

EXAMPLE 3

The dielectric polybenzoxazole is applied to a silicon wafer by the spin-coating technique, pre-dried at 100° C.

and cured on a hotplate for 1 min each at 200° C., 260° C. and 350° C. under nitrogen. The surface is then activated in a water-gas plasma (CO:H2 as 1:1; 500 W, 50 sccm, 50 mTorr). The activated surface is immersed for 10 s in deionized water, the water is spun off and the wafer is dried for 60 s at 120° C. A second coat of polybenzoxazole is then applied by screen printing, pre-dried and—as above—cured. The plasma activation creates a surface containing carboxyl groups.

EXAMPLE 4

A photosensitive polyimide is applied to a silicon substrate by a horizontal spin-coater at 5000 rpm. The spin-coating time is 20 s. The film is subsequently pre-dried for 3 min at 100° C. on a hotplate and then heat-treated (cured) in an oven under nitrogen flushing for 30 min at 400° C. After cooling to room temperature, a photosensitive polybenzoxazole (PBO) is spin-coated onto the polyimide layer; dried on a hotplate, exposed through a mask using an illumination device and developed in an aqueous alkaline solution, washed and dried. The substrate is heat-treated on a hotplate with the following profile: 10° C./min to 150° C., 5° C./min to 280° C., holding time 10 min. It is then cooled to room temperature. The PBO is used as a mask for the polyimide. To activate the polyimide, the substrate is subsequently immersed for 10 min in an alkaline permanganate solution, consisting of 140 g/l sodium permanganate and 50 g/l sodium hydroxide, at a temperature of 40° C., washed with deionized water and then immersed in 5 mol/l sulfuric acid for 3 min. It is subsequently washed with deionized water.

The polybenzoxazole layer also serves to reduce significantly the relatively high water-vapor permeability of polyimide.

EXAMPLE 5

Similar to Example 4, but the polyimide is activated using a short plasma-etching operation with oxygen in a reactive ion etcher (30 sccm oxygen, 500 W, 70 mTorr 10 s) with subsequent conditioning for 3 min in a conditioning bath. The latter may, for example, be a 0.5 molar sodium hydroxide solution in water.

EXAMPLE 6

A photosensitive PBO is spin-coated onto a substrate with a silicon nitride surface and dried on a hotplate, and subsequently heat-treated (cured) on a high-temperature hotplate under nitrogen at 350° C. After cooling to room temperature, a polyimide is spin-coated onto the PBO layer and dried on a hotplate. Using an illumination device, the polyimide is patterned, exposed and developed, washed (isopropanol, isopropanol/demonized water (1:1) and finally deionized water), then dried. To cure the polyimide, the substrate is heat-treated in an oven under nitrogen flushing for 60 min at 350° C. After cooling to room temperature, to activate the polyimide, the substrate is immersed for 10 min in a 1.5% strength by weight sodium hydroxide solution at a temperature of 40° C., washed with deionized water and then immersed in 5 mol/l sulfuric acid for 3 min.

The polybenzoxazole layer between the substrate and the polyimide is advantageous since it serves as a stress-compensation layer and adheres better at the two interfaces than the polyimide adheres to the substrate.

EXAMPLE 7

PBO is spin-coated onto a substrate as in Example 6 and is heat-treated. Using the stencil printing process, a cyclothene layer (benzocyclobutene, BCB) is applied to the PBO layer and baked for 30 min at 250° C. The BCB is activated by immersing the substrate in a 1.5% strength sodium hydroxide solution at 40° C. for 5 min.

EXAMPLE 8

A photosensitive polyimide is spin-coated onto a substrate, then dried for 2 min at 110° C. and subsequently heat-treated at 350° C. for 90 min. As a mask for the selective activation of the polyimide, and to reduce its gas and vapor permeability, a 0.5 µm thick amorphous hydrocarbon layer is deposited using a shadow mask by means of a CVD (chemical vapor deposition) process. The polyimide is subsequently activated as in Example 4. The metallization can likewise be carried out according to Example 4.

EXAMPLE 9

A polyimide is spin-coated onto a silicon substrate (20 s at 5000 rpm), subsequently dried (3 min at 100° C. on a hotplate) and heat-treated for 30 min on a hotplate at 350° C. After cooling to room temperature, another, photosensitive polyimide is spin-coated on, dried at 90° C., exposed, developed, washed (isopropanol, isopropanol/deionized water (1:1) and finally deionized water) subsequently dried and heat-treated at 400° C.

The non-photosensitive polyimide, which forms the lower layer, is activated as follows:

Immersing (10 min) in a 1.5% strength sodium hydroxide solution at a temperature of 45° C., washing with deionized water and subsequent immersing in a 1M HCl solution at 30° C. for 30 min, washing again with deionized water.

EXAMPLE 10

A wafer with a 4 µm thick pre-cyclicized polyimide layer ("substrate") is processed as follows: a water-impermeable silicon nitride layer (50 nm) is applied to the substrate by a CVD process and the nitride layer is patterned using a photoresist (exposing and developing the photoresist, dry-chemically etching the nitride layer with CHF3/O2, stripping the photoresist). The plasma etching is stopped at the underlying polyimide coat. The plasma etching creates an activated surface.

EXAMPLE 11

Similar substrate to Example 10, on which the silicon oxide layer is applied pre-structured via a shadow mask. The bare polyimide is activated by immersion (1 min) in concentrated nitric acid at 50° C.

According to the invention, it is for the first time possible, in the case of a component such as a wafer with a conductor/insulator/conductor layer structure, to combine the physical properties of two insulating layers, one of the insulating layers being selectively activated and capable of being rendered electrically conductive by a metallization or the like.

Examples of photosensitive polyimides and polybenzoxazoles:

polyimide: EP 0 027 506 B1
polybenzoxazole: EP 0 023 662 B1, EP 0 264 678 B1

What is claimed is:

1. A component, which comprises:
   a substrate;
   a lower insulating layer having a layer thickness between 0.05 µm and 50 µm and having a region;

at least one upper insulating layer having a layer thickness between 0.05 μm and 50 μm, being chemically different and have different physical property profiles from said lower insulating layer, and having a region; and at least one activated region that is selectively activated using an activator selected from the group consisting of a gas, a liquid, a solution, and plasma;

said at least one activated region being selected from the group consisting of said region of said lower insulating layer and said region of said at least one upper insulating layer, said activated region therefore being an activated insulating layer;

said lower insulation layer located adjacent said at least one upper insulation layer;

said activated region being one of a selectively modified region and a surface of said activated insulating layer such that subsequently only said activated region can be subjected to a process selected from a group of metallization, photosensitization, and hydrophobicization.

2. The component according to claim 1, wherein said substrate, said lower insulating layer, and said at least one upper insulating layer form a component selected from the group consisting of an electronic component and a microelectronic component.

3. The component according to claim 1, wherein said at least one said upper layer is a layer selected from the group consisting of a patterned layer and a mask layer for activating said lower layer.

4. The component according to claim 1, wherein said at least one activated region is a region selected from the group consisting of a needed region and a metallized region.

5. A process for producing a component, which comprises:

in a first working step, applying a lower insulating layer having a layer thickness between 0.05 μm and 50 μm to a substrate;

in a second working step, selectively activating at least one region of the lower insulating layer using an activator selected from the group consisting of a gas, a liquid, a solution and plasma for forming an activated region being one of a selectively modified region and a surface of the lower insulating layer; and in a third working step, applying at least one upper insulating layer having a layer thickness between 0.05 μm and 50 μm and being chemically different and have different physical property profiles from the lower insulating layer to the lower, activated insulating layer and patterning the at least one upper insulating layer.

6. The process according to claim 5, which comprises patterning the lower insulating layer in the first working step.

7. The process according to claim 5, which comprises choosing a selected layer from the group consisting of the at least upper one insulating layer and the lower insulating layer and patterning the selected layer after the selected layer has been applied.

8. A process for producing a component, which comprises:

in a first working step, applying a first insulating layer having a layer thickness between 0.05 μm and 50 μm to a substrate;

in a second working step, applying a second insulating layer having a layer thickness between 0.05 μm and 50 μm and being chemically different and have different physical property profiles from said at least one lower insulating layer and patterning the second insulating layer; and in a third working step, selectively activating a layer selected from the group consisting of the first insulating layer and the second insulating layer using an activator selected from the group consisting of a gas, a liquid, a solution, and plasma far forming an activated insulating layer, the activating step includes the step of selectively modifying a region or a surface of the insulating layer.

9. The process according to claim 8, which comprises patterning the first insulating layer during the first working step.

10. The process according to claim 8, which comprises patterning the second insulating layer after the second working step and before the third working step.

11. The process according to claim 10, which comprises patterning the first insulating layers after the first working step.

12. The process according to claim 8, which comprises patterning the first insulating layer, after the first working step.

* * * * *